Jan. 27, 1959 K. LEHOVEC 2,871,149

SEMICONDUCTOR METHOD

Filed May 2, 1955

INVENTOR.
KURT LEHOVEC
BY
Connolly and Hutz
HIS ATTORNEYS 2,871,149

SEMICONDUCTOR METHOD

Kurt Lehovec, Williamstown, Mass., assignor to Sprague Electric Company, North Adams, Mass., a corporation of Massachusetts Application May 2, 1955, Serial No. 505,214

3 Claims. (Cl. 148—1.5)

Figure 1:
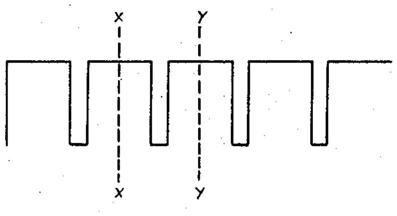

This invention relates to and has for its object a method for the preparation of junction transistors useful in signal translating devices of various types. Although many forms of transistors have been made in the past, including point contact, filamentary and junction, the latter type has now almost completely pre-empted the field due to its lower noise, higher gain, greater consistency, etc.

The junction transistor broadly consists of a semiconductor material body having three or more areas of different conductivity. The p-type areas are those having a deficiency of electrons while the n-type areas are characterized by containing an excess of electrons. For example, in an n-p-n type transistor, one would find two areas, each having an excess of electrons and, sandwiched between them, a middle thin area having a deficiency of electrons. Many methods are available for producing these transistors.

Thus, for example, the junctions may be made by alloying indium into the opposite faces of a germanium wafer, the latter containing an n-type impurity. The alloy contains enough indium so that it behaves as a metal rather than a p-type semiconductor, In the interior, beyond the alloy region, the concentration of indium (or p-type impurity) drops rapidly until it is balanced by the n-type impurity present in the original germanium crystal. The junctions occur where the concentrations of n-type and p-type impurities are equal. Other acceptor or donor materials may be substituted as desired to form the proper junctions. Also, rate-grown multiple junction transistors may be made as described in Shea "Transistor Audio Amplifiers," Wiley & Sons, N. Y., N. Y., p. 2.

According to the present invention, n-p-n (or p-n-p) junction transistors of more efficient and more effective operational characteristics may be made by cutting a slot in a bar of single crystal semiconductor material, then filling the slot with a semiconductor material of the opposite type of conductivity in molten form. Thus, for example, if an n-type silicon crystal is used, a product consisting of the crystal with a p-type semiconductor-filled slot results. The slotted bars are then cut so as to produce the n-p-n or p-n-p junction crystal after which leads are attached in the usual manner to form the final product.

Another method of obtaining junction transistors of similar utility is to use a single crystal plate of one type of semiconductor material, spin the plate at a fast rate (10–1000 revolutions per second), then drop sufficient liquid semiconductor material of the opposite type of conductivity on the plate so that it spreads in a thin film over the base plate, then solidifies. Repeating this operation again to form a thin film of the base-type semiconductor material forms the multiple junction product, to which the usual leads are attached.

The semiconductor material used in the invention is preferably germanium or silicon. However, other semiconductor materials may be substituted. Likewise, the donor or acceptor elements used to alter the semiconductor materials and make them n-type or p-type are those normally employed. Thus, non-volatile elements of group III–A of the periodic table, such as boron, aluminum, gallium and indium may be used as acceptor elements to form p-type materials; and non-volatile elements of group V–A of the periodic table, such as phosphorous, arsenic and antimony may be used as donor elements to form n-type materials. In the present invention one may use the same semiconductor material, with donor and acceptor elements being added to yield n- or p-type substances. One may also produce "mixed junctions" by using different semiconductor materials. For example, one may use an n- (or p) type silicon matrix and a p- (or n) type germanium filler or disc.

Figure 2:
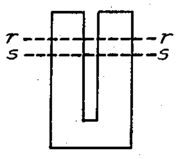
Figure 3:
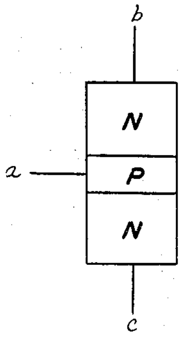
Figure 4:
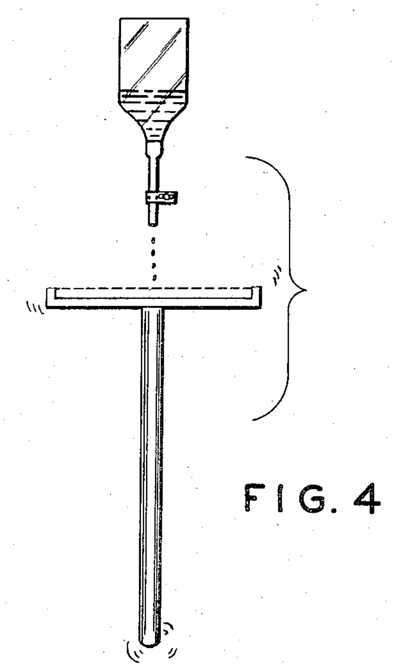

The invention may be more readily understood from a study of the accompanying drawing which is illustrative only and in which:

Figure 1 represents a cross section of the slotted bar for use in preparing the multiple junction, Figure 2 represents a cross section of junction crystal after fabrication, Figure 3 represents an end view of a junction transistor made according to the invention, and Figure 4 represents the multiple junction device made by spinning.

In the drawings the slots and other sections have been represented in enlarged form and not in the proportions found in the actual construction. This has been done merely for clarity and ease in visualizing the invention.

More specifically Figure 1 shows a solid bar of n-type silicon, slotted to enable the insertion of p-type silicon to form the n-p junctions; and Figure 2 shows the filled n-p-n crystal which has been sliced from the crystal of Figure 1 along lines *x*—*x* and *y*—*y* after filling. The crystal of Figure 2 is sliced along lines *r*—*r* and *s*—*s* to produce the n-p-n junction bar. After final fabrication the n-p-n junction transistor produced from the processed crystals of Figures 1 and 2 is shown in Figure 3 with attached electrodes *a*, *b* and *c*. In Figure 4 a single crystal of n-type germanium wafer is spun at high speed while a drop of p-type germanium is allowed to fall on the spinning wafer to form a thin surface cover.

Following are specific working examples showing illustrative methods carrying out the invention. It is to be specifically understood, however, that although these methods are typical, they are by no means intended to limit the invention.

*Example 1*

A bar of single crystal, n-type silicon of 2 mil thickness is slotted by magnetostrictive cutting to produce a depression approximately one mil in thickness. The walls of the depression are then carefully cleaned by etching in accordance with standard procedures (e. g. a mixture of 6 cc. HF, 5 cc. concentrated $HNO_3$ and 6 cc. glacial acetic acid acting on the crystal for five minutes), and then heated to a temperature close to the melting point, i. e. 1400° C. Liquid silicon containing p-type impurities is then poured into the slot and allowed to solidify, and from this crystal n-p-n junction bars may be cut and appropriate electrodes are attached to form the transistor.

A practical method of filling the slot is as follows: Liquid p-type silicon containing boron as the impurity is maintained under vacuum in a quartz crucible. The solid silicon crystal, doped with arsenic for n-type conductivity, is dipped, slotted side down, into the melt. The slot is such that an evacuated space arises, bounded by solid silicon and by liquid silicon. An inert gas (i. e. argon) is simultaneous with dipping let into the vacuum, forcing the silicon to rush into the evacuated space mentioned above, thus effecting filling of the slot prior to substantial melting of the block.

*Example 2*

A further modification of the above example is accomplished by using a crystal of 97% by weight of germanium and 3% by weight of silicon multiply-slotted to 1 mil depths with four slots. The slotted crystal of germanium-silicon alloy was cut by magnetostrictive means, the techniques of which are fully set forth in the Balmuth United States Patent No. 2,580,716, as well as the November 1954 issue of "Transactions of the I. R. E.," "Professional Group on Ultrasonics Engineering," pages 10–23. The etched slotted germanium-silicon crystal of p-conductivity, doped with boron, is heated to about 900° C. and thereafter dipped into a liquid germanium melt, n-conductivity as doped with arsenic, using the same vacuum and inert gas technique of Example 1. In this procedure the germanium-silicon alloy crystal does not suffer as extensive surface melting as did the crystal of Example 1.

This procedure of Examples 1 and 2 may be used with either n- and p-type semiconducting materials of the same element or it may be used to produce mixed junctions wherein different semiconducting materials are used, one for the matrix and another for filling slot.

*Example 3*

To prepare a multiple junction transistor by spinning, a single crystal wafer of semiconducting material (e. g. n-type germanium heated to 900° C.) is allowed to rotate at a high speed (100 revolutions per second) and a semiconducting material in liquid form and of the opposite type (e. g. p-type germanium heated to 970° C.) is allowed to drop on the center of the crystalline wafer after which the centrifugal force effects the production of thin film over the single crystal wafer; this process is repeated with liquid n-type germanium heated to 970° C. to produce the n–p–n junctions. The crystal is then sliced and etched after which leads are placed thereon, each operation with well-known techniques, to form the transistor.

The invention may be variously otherwise embodied within the scope of the appended claims.

What is claimed is:

1. The method which comprises spinning a single crystal wafer of semiconducting material heated to slightly below the melting point at between 10 and 1000 revolutions per second and dropping liquid semiconducting material containing impurities of the opposite type than the single crystal wafer on the center of the crystalline wafer while rotation is continued, then repeating the process with a liquid semiconductor material containing impurities of the same type as the single crystal wafer.

2. A method of forming very thin layers of semiconductor material, which comprises rotating a support at between 10 and 1000 revolutions per second while maintaining the support at a temperature slightly below the melting point of the semiconductor, dropping liquid semiconducting material containing desired impurities on the surface of the support while said surface is undergoing said rotation to cause the applied liquid to be thrown out and form a very thin film on said surface, then solidifying the very thin film.

3. The method which comprises heating to slightly below the melting point a single crystal wafer of semiconducting material having impurities that give it one type of electrical conductivity, rotating the crystal at between 10 and 1000 revolutions per second in the plane of one of its surfaces, dropping liquid semiconducting material containing impurities of the opposite type on the center of said surface while it is undergoing said rotation, and solidifying the applied liquid.

References Cited in the file of this patent

UNITED STATES PATENTS

| | | |
|---|---|---|
| 2,488,369 | Blackburn | Nov. 15, 1949 |
| 2,597,028 | Pfann | May 20, 1952 |
| 2,629,672 | Sparks | Feb. 24, 1953 |
| 2,683,676 | Little et al. | July 13, 1954 |
| 2,692,839 | Christensen | Oct. 26, 1954 |
| 2,762,730 | Alexander | Sept. 11, 1956 |
| 2,765,245 | English et al. | Oct. 5, 1956 |

FOREIGN PATENTS

| | | |
|---|---|---|
| 1,088,286 | France | Sept. 8, 1954 |
| 46,712 | Switzerland | Feb. 24, 1909 |